United States Patent [19]
Hilbert

[11] 4,371,747
[45] Feb. 1, 1983

[54] AM STEREOPHONIC DECODER

[75] Inventor: Francis H. Hilbert, Addison, Ill.

[73] Assignee: Motorola, Inc., Schaumburg, Ill.

[21] Appl. No.: 133,189

[22] Filed: Mar. 24, 1980

[51] Int. Cl.³ .............................................. H04H 5/00
[52] U.S. Cl. .................................. 179/1 GS; 329/135
[58] Field of Search ............. 179/1 GS; 329/135, 167, 329/168

[56] References Cited

U.S. PATENT DOCUMENTS

| | | | |
|---|---|---|---|
| 3,007,005 | 10/1961 | Moore et al. | 179/1 GS |
| 3,043,914 | 7/1962 | Collins | 179/1 GS |
| 3,067,293 | 12/1962 | Moore | 179/1 GS |
| 3,068,419 | 12/1962 | Collins | 328/171 |
| 3,068,475 | 12/1962 | Avins | 179/1 GS |
| 3,080,453 | 3/1963 | Avins | 179/1 GS |
| 3,089,096 | 5/1963 | Moore | 179/1 GS |
| 3,167,614 | 1/1965 | Holt et al. | 179/1 GS |
| 3,218,393 | 11/1965 | Kahn | 179/1 GS |
| 3,231,672 | 1/1966 | Collins et al. | 179/1 GS |
| 3,534,172 | 10/1970 | Weeda | 179/1 GD |
| 3,823,268 | 7/1974 | Modafferi | 179/1 GD |
| 3,908,090 | 9/1975 | Kahn | 179/1 GS |
| 4,018,994 | 4/1977 | Kahn | 179/1 GS |
| 4,037,057 | 7/1977 | Ogita et al. | 179/1 GD |
| 4,079,204 | 3/1978 | Takahashi et al. | 179/1 GS |
| 4,172,966 | 10/1979 | Parker et al. | 179/1 GS |
| 4,218,586 | 8/1980 | Parker et al. | 179/1 GS |

Primary Examiner—Douglas W. Olms
Attorney, Agent, or Firm—James W. Gillman; James S. Pristelski; Margaret Marsh Parker

[57] ABSTRACT

A decoder for use with a compatible AM stereophonic signal utilizes a amplifier and a feedback loop from the amplifier output to control the output of a multiplier circuit which is one input to the amplifier. The amplifier output is thus forced to become the required correction factor used in restoring the stereo program signals.

7 Claims, 4 Drawing Figures

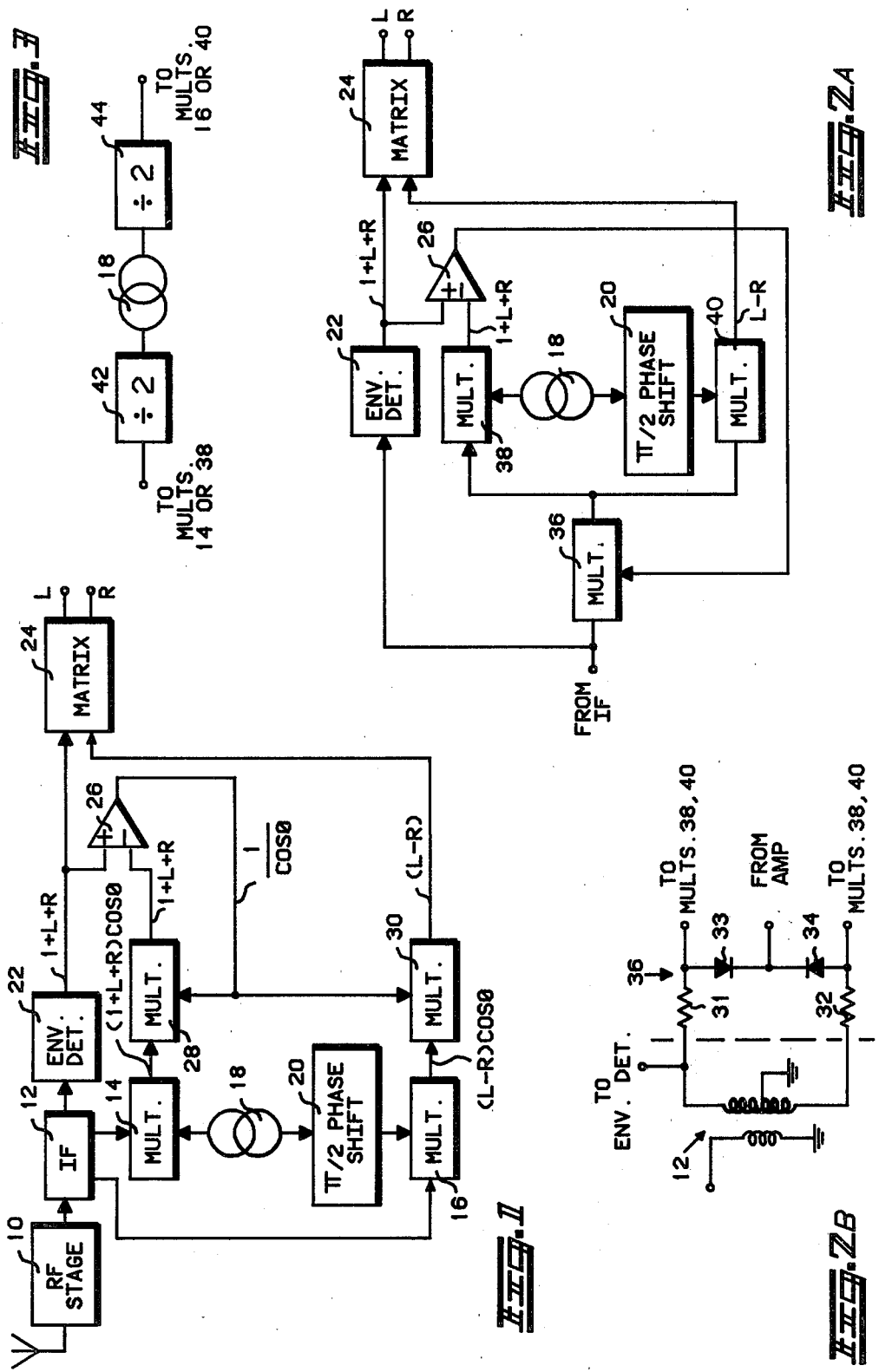

AM STEREOPHONIC DECODER

BACKGROUND OF THE INVENTION

This invention relates to the field of compatible AM stereo signals and, more particularly, to the provision of an improved means of restoring stereo program signals.

In one known receiver for decoding stereo signals from a received signal of the form $(1+L+R)\cos(\omega_c t+\phi)$ where $\phi$ is arc $\tan[(L-R)/1+L+R)]$, approximate stereo signals of the form R cos $\phi$ and L cos $\phi$ were obtained from two synchronous detectors. This receiver was disclosed in U.S. Ser. No. 7,733 filed Jan. 30, 1979. A cos $\phi$ correction signal was determined by means of a limiter and phase locked loop, and the two approximate signals were divided by the cos $\phi$ correction signal to retrieve the stereo information signals. Another receiver disclosed in Ser. No. 837,258, filed Sept. 27, 1977, derived the sum signal $(1+L+R)$ by means of an envelope detector, and the difference signal was obtained from a signal $(L-R)\cos\phi$ by division by a signal proportional to cos $\phi$.

SUMMARY OF THE INVENTION

It is an object of the present invention to provide an improved means of decoding a compatible AM stereophonic signal to obtain the original information signals.

This object and others which will become apparent are obtained in a circuit utilizing multiplier circuits, an amplifier and a feedback loop. The amplifier compares the true amplitude modulation signal with a signal approximately the true signal and feeds back a correction signal which will force the approximate signal to approach the true signal. The correction signal, which is the inverse of cosine $\phi$, is also coupled to another multiplier having a second input of $(L-R)\cos\phi$. That multiplier output signal $(L-R)$ is coupled to a matrix along with the true amplitude modulation signal, and the matrix output signals are then L and R.

BRIEF DESCRIPTION OF THE DRAWINGS

FIG. 1 is a block diagram of a receiver in accordance with the invention.

FIG. 2A is a block diagram of a second embodiment of the invention.

FIG. 2B is a schematic diagram of one portion of FIG. 2A.

FIG. 3 is a schematic diagram of a second embodiment of one portion of the block diagrams.

DETAILED DESCRIPTION OF THE PREFERRED EMBODIMENT

In FIG. 1, a signal of the form $(1+L+R)\cos(\omega_c t+\phi)$ is received and detected in an RF stage 10, processed in an IF stage 12, and coupled to multipliers 14, 16. A local oscillator 18 output is coupled directly to multiplier 14, and through a 90° phase shifter 20, to multiplier 16. The output signal from multiplier 14 is then $(1+L+R)\cos\phi$. The output signal from the multiplier 16 is the quadrature signal $(L-R)\cos\phi$.

The output of the IF stage 12 is also coupled to an envelope detector 22. The output of the detector is then $1+L+R$, the compatible monophonic signal. This sum signal is normally coupled to a matrix 24, and is also coupled to one input of a high gain operational amplifier 26. The inverting input of the amplifier is coupled from the output of a multiplier 28, and the output of the amplifier is coupled back to an input of the multiplier 28. The second input of multiplier 28 comes from the multiplier 14. The combination of the multiplier 28, amplifier 26 and the feedback loop forces the output signal of multiplier 28 to become $1+L+R$, which could, of course, be coupled to the matrix 24 in place of the output signal from the envelope detector 22. The amplifier 26 may also comprise a comparator/amplifier rather than an operational amplifier, since high gain is not required.

The output signal of the amplifier 26, which approaches $1/\cos\phi$ very closely, depending on the gain of the amplifier, is also coupled to an input of a fourth multiplier 30. The other input of the multiplier 30 is the $(L-R)\cos\phi$ output signal from the multiplier 16, thus the multiplier 30 output becomes $L-R$. This difference signal is coupled to the matrix 24 which outputs the original left (L) and right (R) information signals. The four multipliers 14, 16, 28, 30 may be implemented by one four-quadrant multiplier integrated circuit such as the Motorola MC1595 chip.

A slightly different embodiment of the invention is shown in FIGS. 2A and 2B, in which the antenna and RF stage 10 have been omitted for simplicity. The IF stage 12 has been represented by a transformer (FIG. 2B) and is coupled to the envelope detector 22, and the envelope detector output is coupled to the amplifier 26 and the matrix 24 as in FIG. 1. Two resistors 31, 32 are coupled to the transformer secondary and two diodes 33, 34 are coupled across the secondary to function as multiplier 36, and a current proportional to the amplifier 26 output is coupled to the junction point of the two diodes. The diode 36 output terminals are coupled to two multipliers 38, 40 as are the local oscillator 18 and 90° phase shifter 20. Thus the multiplication process (times $1/\cos\phi$) takes place in the multiplier 36 rather than in multipliers 28, 30 of FIG. 1. The respective output signals of multipliers 38, 40 are then $(1+L+R)$ and $(L-R)$. The function of amplifier 26 is the same as in FIG. 1; i.e., to force the output of multiplier 38 to approach $1+L+R$ by means of the feedback to multiplier 36. As before, the matrix receives $1+L+R$ and $L-R$ and provides at the output terminals the original information signals L and R.

In FIG. 3 is shown a second embodiment of the oscillator/phase shifter combination, wherein the oscillator output is coupled to two divide-by-two dividers 42, 44. The dividers divide in opposite phases and thus their outputs are in quadrature.

Thus, there has been shown and described an improved means of decoding compatible AM stereophonic signals to provide the original information signals. It will be apparent to those skilled in the art that other modifications and variations of the present invention may be made and it is intended to cover all such as fall within the spirit and scope of the appended claims.

What is claimed is:

1. A receiver for receiving AM stereophonic signals of the form $(1+L+R)\cos(\omega_c t+\phi)$ where L and R are information signals, $\omega_c t$ is a carrier frequency, and $\phi$ is arc tan $\{(L-R)/)1+L+R)\}$, and comprising:
   means for selectively receiving said stereophonic signals;
   means coupled to the selective receiving means for detecting the amplitude modulation on the received signal;
   means for providing two carrier signals in quadrature;

multiplier means coupled to the selective receiving means and to the carrier signal means;

amplifier means coupled to the amplitude detection means and the multiplier means for providing a correcting signal proportional to the inverse of cosine $\phi$, said correcting signal being coupled back to the multiplier means for providing a pair of multiplier output signals which are substantially equal to $1+L+R$ and $L-R$; and matrixing means coupled to receive the signals $(1+L+R)$ and $(L-R)$ and to provide output signals substantially equal to L and R.

2. A receiver in accordance with claim 1 wherein the multiplier means comprises a first multiplier coupled to multiply a signal from the selective receiving means and a first signal from the carrier signal providing means, a second multiplier coupled to multiply the signal from the selective receiving means and a second signal from the carrier signal providing means, a third multiplier coupled to multiply the output signal of the first multiplier and the output signal of the amplifier means, a fourth multiplier coupled to multiply the output signal from the second multiplier and the output signal from the amplifier means.

3. A receiver in accordance with claim 1 wherein the multiplier means comprises a first multiplier coupled to multiply a signal from the selective receiving means and a signal from the amplifier means, a second multiplier coupled to multiply a signal from the first multiplier and a signal from the carrier providing means, and a third multiplier coupled to multiply the signal from the first multiplier and a second signal from the carrier providing means.

4. A receiver in accordance with claim 3 wherein the first multiplier means comprises two diodes coupled across a current proportional to the output of the selective receiving means, and the amplifier means output provides a proportional current source to the junction of the diodes.

5. A receiver in accordance with claim 1 wherein the carrier providing means comprises an oscillator means and a 90° phase shifting means.

6. A receiver in accordance with claim 1 wherein the carrier providing means includes an oscillator and two divider means.

7. A receiver in accordance with claim 1 wherein the selective receiving means comprises an RF stage and an IF stage.

* * * * *